United States Patent [19]

Moffat

[11] Patent Number: 5,128,679
[45] Date of Patent: Jul. 7, 1992

[54] ELECTRONIC COMBAT EFFECTIVENESS MONITOR

[76] Inventor: William V. Moffat, 60 Mission Dr., Pleasanton, Calif. 94566

[21] Appl. No.: 312,699

[22] Filed: Feb. 21, 1989

[51] Int. Cl.⁵ .............................................. G01J 7/36
[52] U.S. Cl. ................................................. 342/13
[58] Field of Search ................. 342/192, 196, 90, 13

[56] References Cited

U.S. PATENT DOCUMENTS 4,069,468  1/1978  Bartram .
4,135,159  1/1979  Kubanoff .
4,241,350  12/1980  Uffelman .
4,348,674  9/1982  Muth et al. .
4,384,292  5/1983  Prime .
4,603,331  7/1986  Wehner .

Primary Examiner—Mark Hellner

[57] ABSTRACT

Waveforms received at a transmitter antenna are Fourier transformed to extract waveform spectrums. These spectrums are enhanced so as to provide near uniform pulse spectrum sidelobe amplitudes. These enhanced side lobe waveforms are then Fourier transformed. The result is conversion of received waveform time domain discontinuities into impulses. The energy in the received waveform is retained. The conversion to impulses provides processing gain. Correlation processing exploits finite differences in both spectrum and impulse conversion characteristic of radar targets, jamming and clutter.

3 Claims, 12 Drawing Sheets

| MODE | PULSE NUMBER | FUNCTION | REF |
|---|---|---|---|
| INITIALIZATION | | TUNE RF CARRIER | 25 26 27 28 |
| | | SELECT "MF" | 36 |
| | | TRIGGER TIMING | 33 34 |
| | | INITIALIZE STC | 22 23 |
| | SAMPLE | STORE "REF" SPECTRUM | 40 50 |
| | | STORE "REF" CEPSTRUM | 41 52 |
| | | VERIFY XTR WAVEFORM | 49 |
| ACQUISITION | 1—4 | CORRELATE SPECTRUM | 42 50 51 |
| | | SELECT COARSE RANGE CELL(S) | |
| | | SET COARSE RANGE GATE(S) | |
| TRACK | 5—8 | CORRELATE CEPSTRUM | 43 52 53 |
| | | DETERMINE HRR LOCATION(S) | |
| | | DECIDE "CANDIDATE" TARGET(S) | 45 |
| | | SET HRR RANGE GATES | |
| | | TRACK ON JAM | |
| DETECT | 9—12 | CORRELATE SPECTRUM | 42 |
| | | DETERMINE TARGET TYPE | 45 |
| | | AIRCRAFT, RPTR, CHAFF | 54 55 |
| | | EXCITER, DRFM | |
| | | CORRELATE CEPSTRUM | 43 |
| DYNAMIC TRACK | 13+ | ESTABLISH DYNAMIC TRACK | 44 |
| CLASSIFY | | CLASSIFY TARGET TYPE | 45 |
| | | DISCRIMINATE HRR FEATURES | 63 |
| ECCM | | EVALUAT ECM/ECCM | 46 |
| | | IDENT ECM TECHNIQUE | 59 |
| | | MEASURE J/S | 60 |
| | | EVAL ECM EFFECTIVENESS | 61 |
| | | SELECT ECCM TECHNIQUE | 62 |
| EXECUTIVE | ALL | CONTROL/MONITOR | 23 27 28 48 49 |

FIG 12

ELECTRONIC COMBAT EFFECTIVENESS MONITOR

BACKGROUND

1. Field of Invention

This invention relates to radar, specifically to improved detection of low observable targets in simultaneous clutter and jamming interference.

2. Description of Prior Art

Radar detection of aircraft and surface targets has historically been limited by surface clutter and thermal noise. Additionally, for military application, targets have been increasingly protected by onboard or stand-off support deception and noise type jamming.

The ability of any radar to recognize a desired target from multiple echo returns, deceptive interference and thermal noise continues to a major radar design challenge. The problem is very difficult when the desired target echo is buried in surface clutter and/or deception jamming.

The modern jamming approach to solution has enhanced resolution in the three information domains: angle (direction), time (range), frequency (Doppler). Basis has been application of fundamental mathematical Fourier analysis and the more recent estimation principles based on information theory. Matched filter-correlation receivers optimize signal to thermal noise. Large time-bandwidth product waveforms increase resolution in Doppler-range.

But, the enhanced resolution has still not removed ambiguities. Sidelobe ambiguities generated by interfering echo waveforms tend to cover desired targets, when desired target echos are weak and in close proximity.

FIGS. 1-4 illustrate Fourier transform relationships for prior art classes of radar waveforms: "Fundamental", "Burst", "Intrapulse".

The Fourier transform from time domain into frequency domain for each waveform illustrates the resolution and ambiguity in frequency (Doppler). The Fourier transform from the first transform squared into the autocorrelation waveform illustrates the resolution and ambiguity in time (range).

The "Fundamental" waveform class is illustrated by a single rectangular pulse. It is ambiguous in frequency, with the first ambiguous sidelobe down 13 dB from the peak. Frequency resolution is the reciprocal of pulse duration. Its autocorrelation waveform is unambiguous in time. Time resolution is proportional to pulse duration.

The "Fundamental" waveform is the classic waveform of early radars. The transform from time to frequency also applies to antenna pattern generation, where time domain represents antenna aperture illumination. The transform represents antenna pattern shape (with ambiguous angle sidelobes). Shaping of the time domain envelope (or aperture illumination) reduces sidelobe amplitudes, but, at the expense of wider main lobe width and reduced time (or angle) resolution.

The "burst" waveform class is illustrated with a high duty cycle sequence of three pulses. "Burst" is the form of waveform used with Pulse Doppler radars, for coherent integration Doppler detection of moving targets. It is ambiguous in both frequency (Doppler) and time (range). Resolution in frequency is increased over the "Fundamental" single pulse, but not in time (range). Resolution in Doppler is the reciprocal of signal duration; typical kilohertz Doppler resolution requires signal integration time of milleseconds, with coherent processing.

The "Intrapulse" waveform class represents the more recent Ambiguity Function developed radar waveform advances. These provide both increased resolution and reduced ambiguity in simultaneous frequency and time. These also permit transmission of long duration pulses, with high energy. In conjunction with matched filter receiver processing, "Intrapulse" enhances Signal to Noise while at the same time improves target resolution in the presence of unwanted interference.

The linear FM "chirp" Intrapulse waveform shown is very ambiguous in frequency. Autocorrelation (time) resolution and processing gain are proportional to transmitted waveform time-bandwidth product. But, it is also ambiguous in time due to autocorrelation sidelobes. These sidelobe magnitudes may be suppressed, at the expense of reduced resolution, by tapering the auto-correlation receiver dechirp envelope (weighting). The analogous process supresses antenna pattern sidelobes with tapered aperture illumination.

The 13 bit Barker phase code further enhances combined energy, resolution and ambiguity.

However, all of the above waveforms suffer from a number of disadvantages:

(a) Finite level ambiguity frequency and/or time sidelobes.
(b) Reduced resolution with sidelobe suppression.
(c) Complex modulations to provide both high energy, long duration signals, with high resolution and suppressed sidelobe ambiguities.
(d) Limited detection and identification of desired low visibility targets in simultaneous clutter/jamming interference.

OBJECTS AND ADVANTAGES

Accordingly, several objects and advantages of the present invention are:

(a) to eliminate ambiguities in range.
(b) to eliminate susceptabilities to jamming deception in range.
(c) to provide high probability, single pulse detection and identification of desired low visibility targets in simultaneous clutter/jamming interference.
(d) to provide high energy content transmissions for matched filter/correlation receiver detection of low visibility targets with high signal to thermal noise.
(e) to provide unambiguous high resolution in range with a single, high energy, long duration pulse.
(f) to provide implementation using simple, conventional, non coherent, pulsed magnetron transmitters.

Further objects and advantages are to provide: means to extract Fourier information from radar received signals, at high speed; logic to discriminate desired targets from interference, at high speed; logic to provide high confidence target classification/identification, determine jammer mode, measure jammer to Skin return ratio, control adaptive Electronic Counter Countermeasures (ECCM); hardware package size and weight that is compatible with high performance aircraft installations; low prime power requirement, high reliability, in a high performance aircraft operating environment.

Still further objects and advantages will become apparent from a consideration of the ensuing description and drawings.

DESCRIPTION OF DRAWINGS

FIG. 8 is for a real radar pulse.

The Microwave Downconverter 18 changes the received waveform carrier to a suitable Wide-Band Intermediate Frequency to accomodate the particular implementation of the analog Signal Feature Extractor 19.

Figure 7:
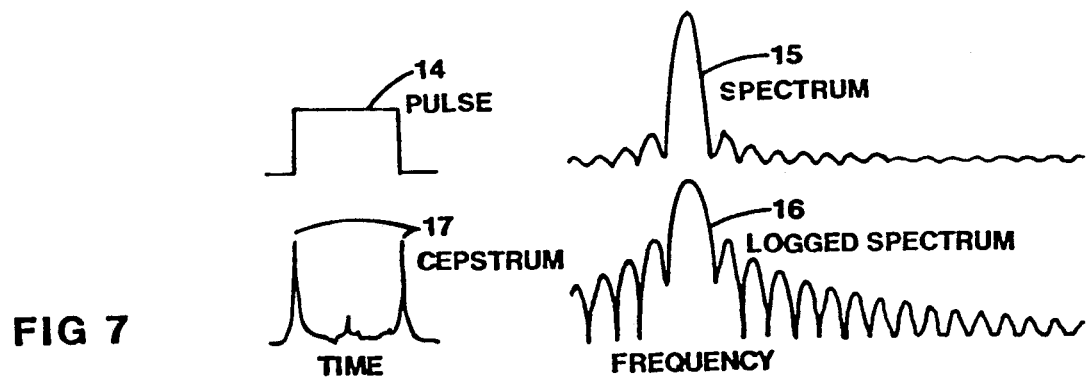
FIGS. 7-8 illustrate application of the FIG. 5-6 impulse pair spectrum relations to discriminate radar waveform time domain (range) discontinuities with high resolution and no ambiguities. Rectangular pulse 14 exhibits finite discontinuities at the leading and trailing edges. Spectrum 15 shows the Fourier transform periodic envelope for that pulse. In accordance with the principle shown in FIGS. 5-6, the logged spectrum 16 shows increased spectrum sidelobe amplitudes. Although this log amplification is a convenient implementation to show the principles, what is desired, in the limit, is to raise the spectrum sidelobes so that the resulting spectrum peak amplitudes are uniform, with peak period uniform. The cepstrum 17 is the Fourier transform of the logged spectrum. The pulse waveform 14 discontinuities have been converted to impulse like "spikes" - - - no ambiguities. Energy of the original pulse has been converted into the two "spikes", with corresponding processing gain.
Figure 8:
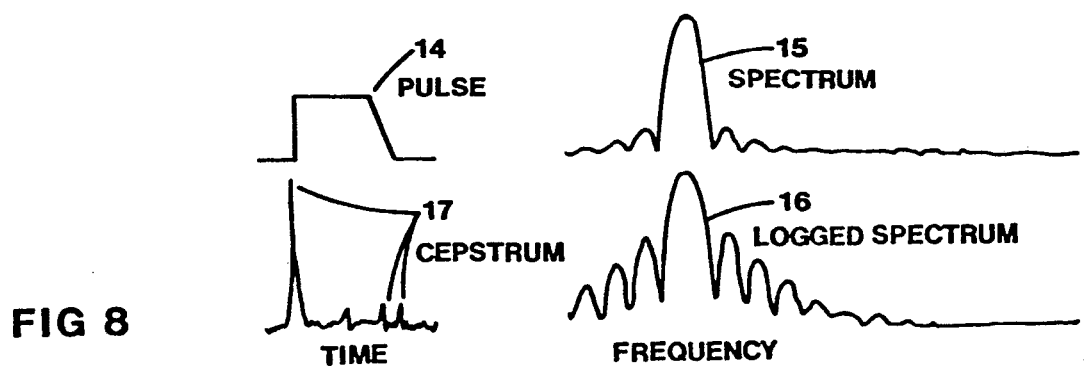

The Signal Feature Extractor 19 provides analog Fourier transforms on coarse range gated samples of the received waveforms. These transforms provides outputs of the form illustrated in FIGS. 7-8; spectrum 15, logged spectrum 16, cepstrum 1/. Actual received spectrums and cepstrums are contaminated by interference, discriminated in logic 20.

Digital logic 20 accomplishes acquisition and range track of candidate targets. Acquisition is the process of discriminating a likely target from simultaneous interference. This logic process is correlation, as illustrated in FIGS. 1-4.

Digital logic 20 also determines ECM effectiveness. This logic then provides adaptive Electronic Courier CounterMeasure (ECCM) control of the host radar transmitted waveform.

Figure 9:
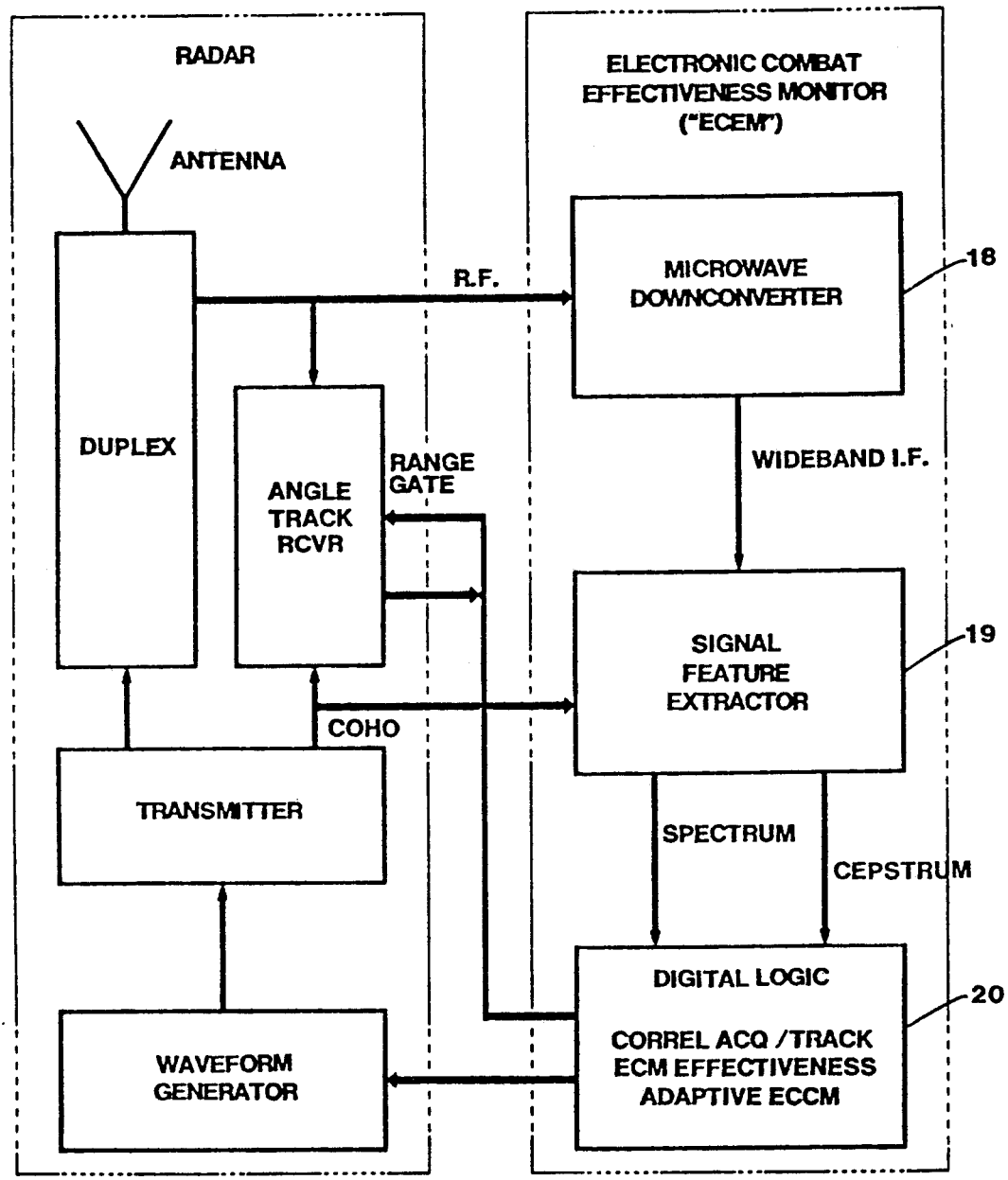
FIG. 9 illustrates the relationship of this invention to a generic radar and its primary functions in aiding the radar targeting functions.
Figure 10:
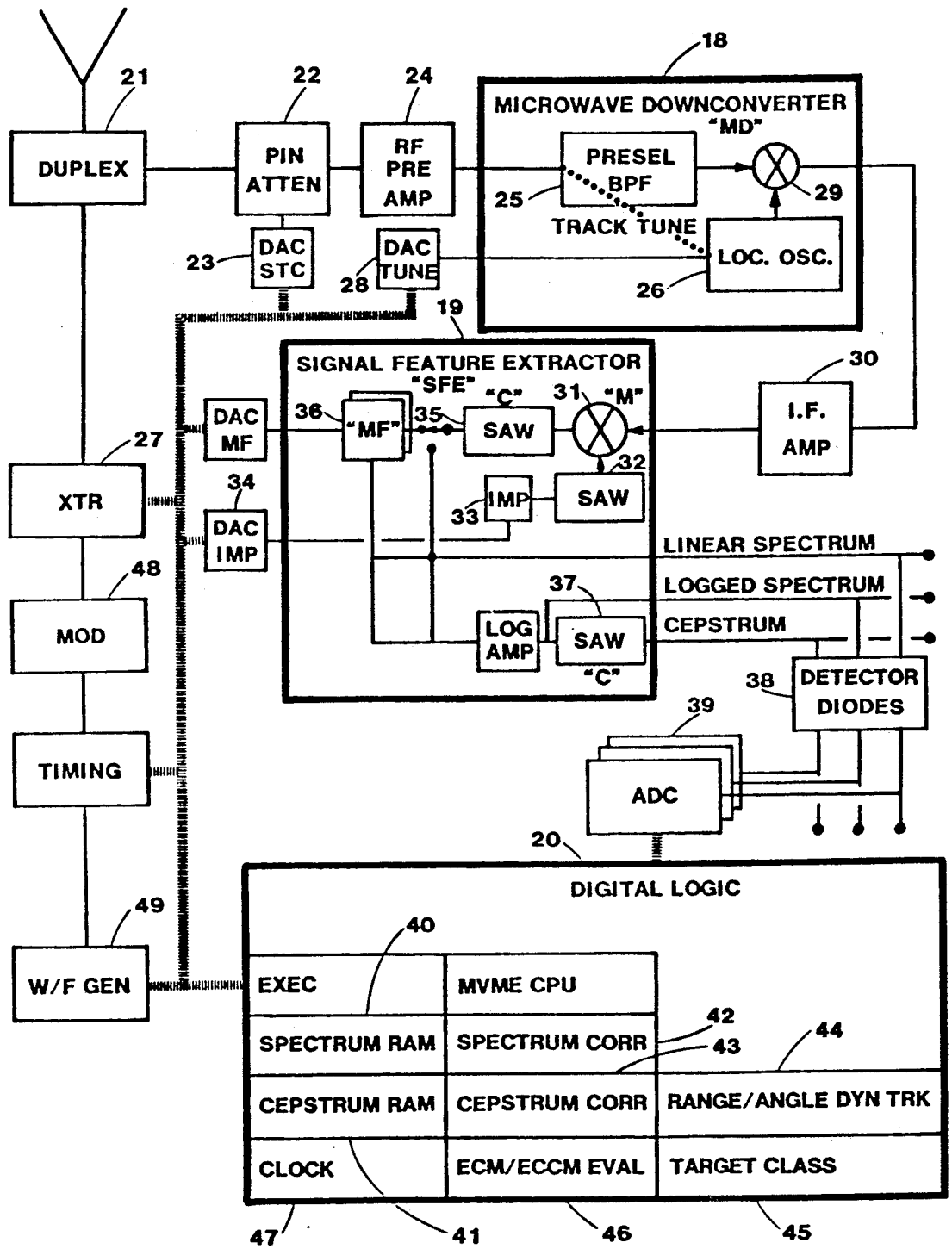

FIG. 10 illustrates the functional elements and signal flow in more detail than FIG. 9.

Figure 11:
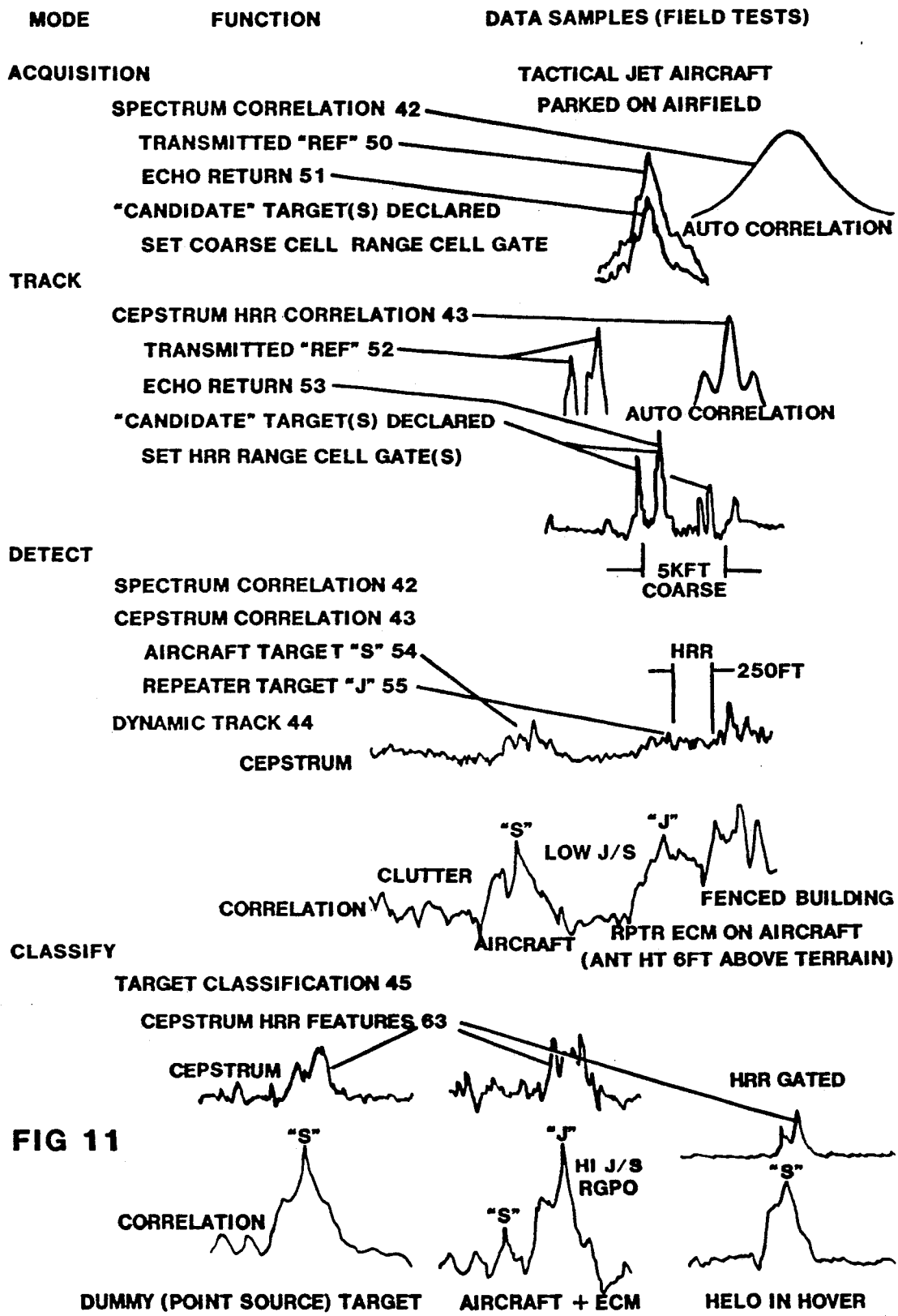

FIG. 11 illustrates application of the correlation logic. This is a form of "track before detect". Successive transmitted echo returns are accessed with increasing range resolution gating, from first pulse acquisition to target classification. FIG. 12 illustrates computer logic flow.

Figure 13:
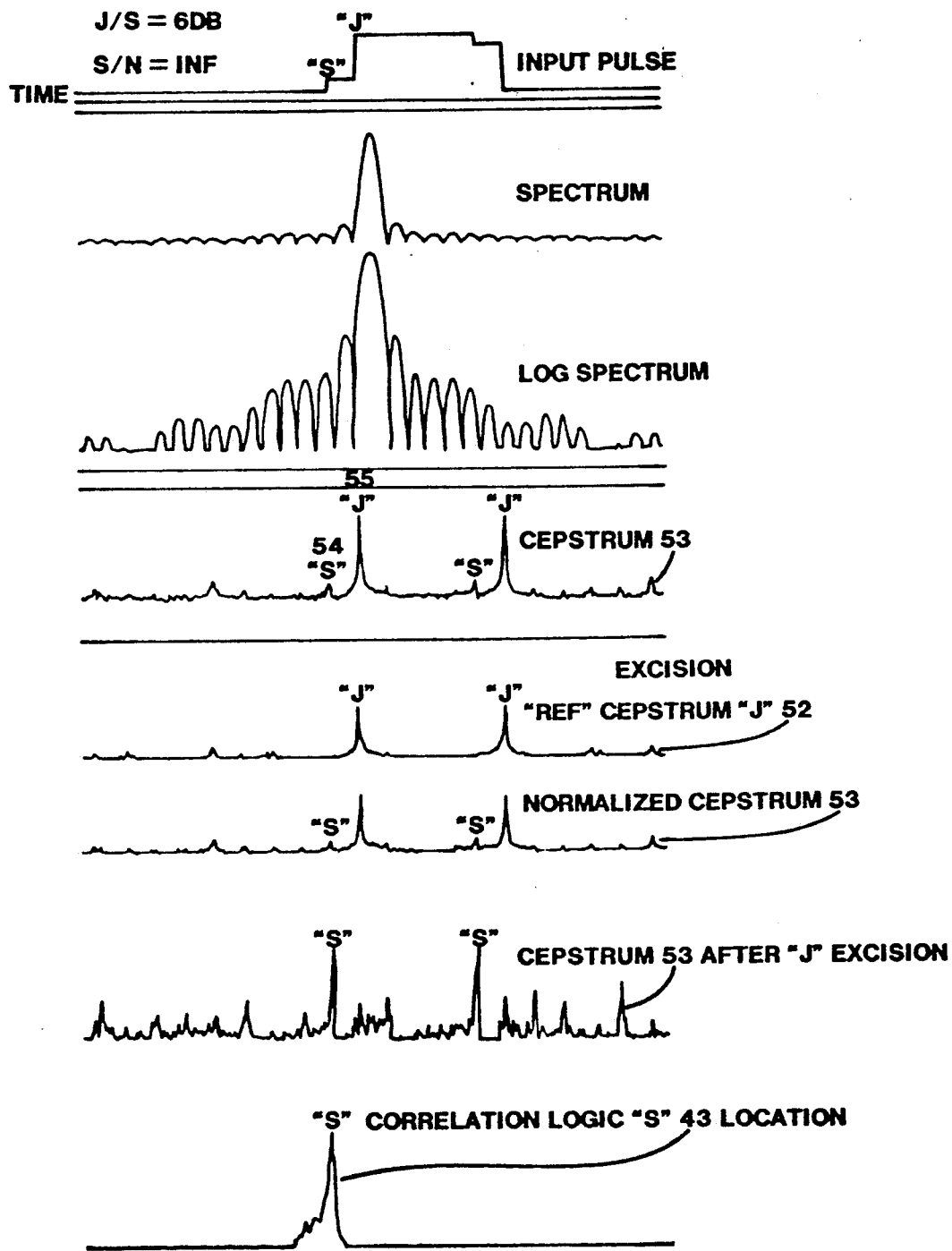
Figure 14:
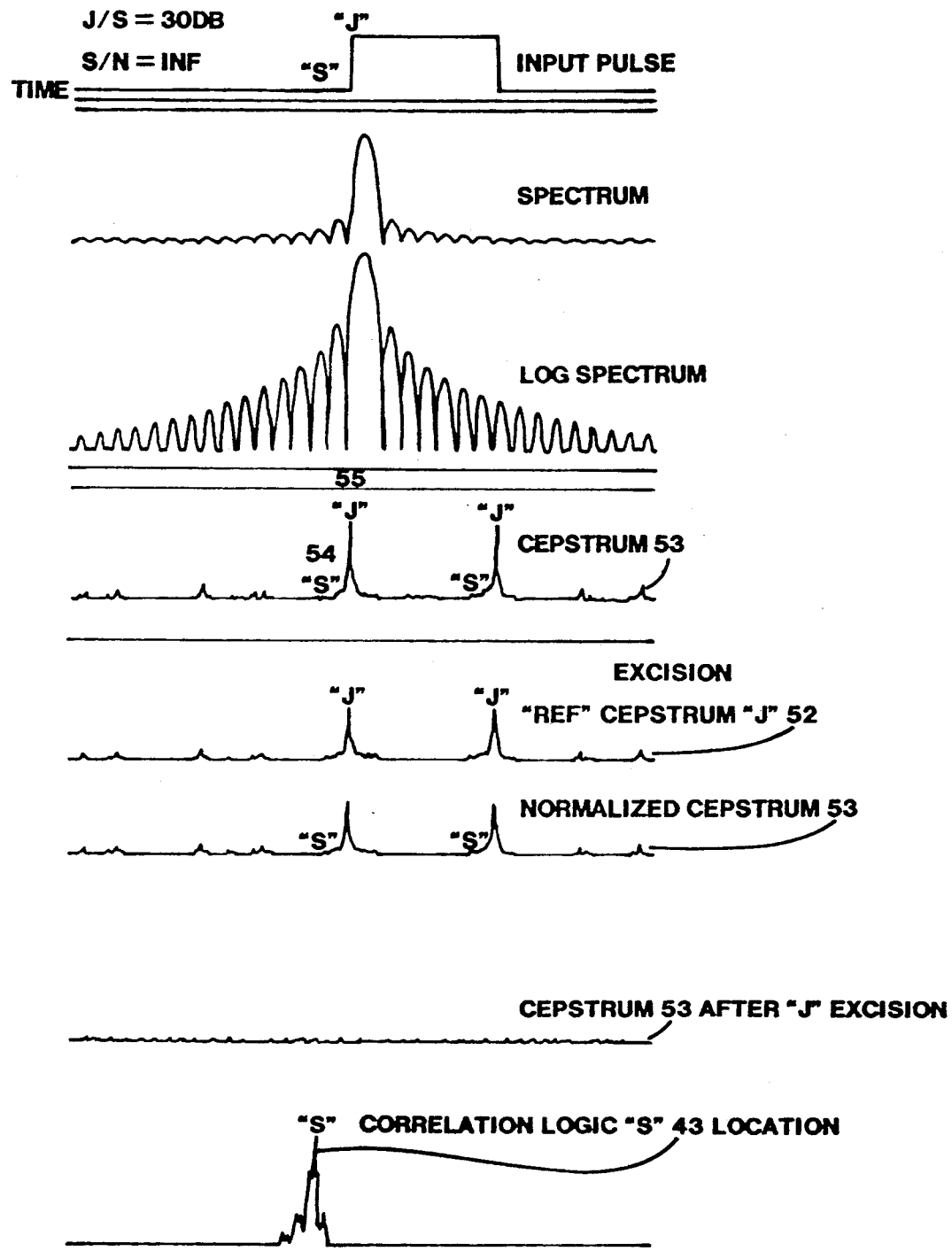

FIGS. 13-14 show the FIG. 9 Digital Logic 20 performance in discriminating a target in the presence of deception repeater jamming. FIG. 13 is the case of J/S = 6 db. FIG. 14 is the case for J/S = 30 db. The logic process illustrated includes cepstrum excision of the likely repeater "J" and correlation detection/location in range of the target, "S".

Figure 15:
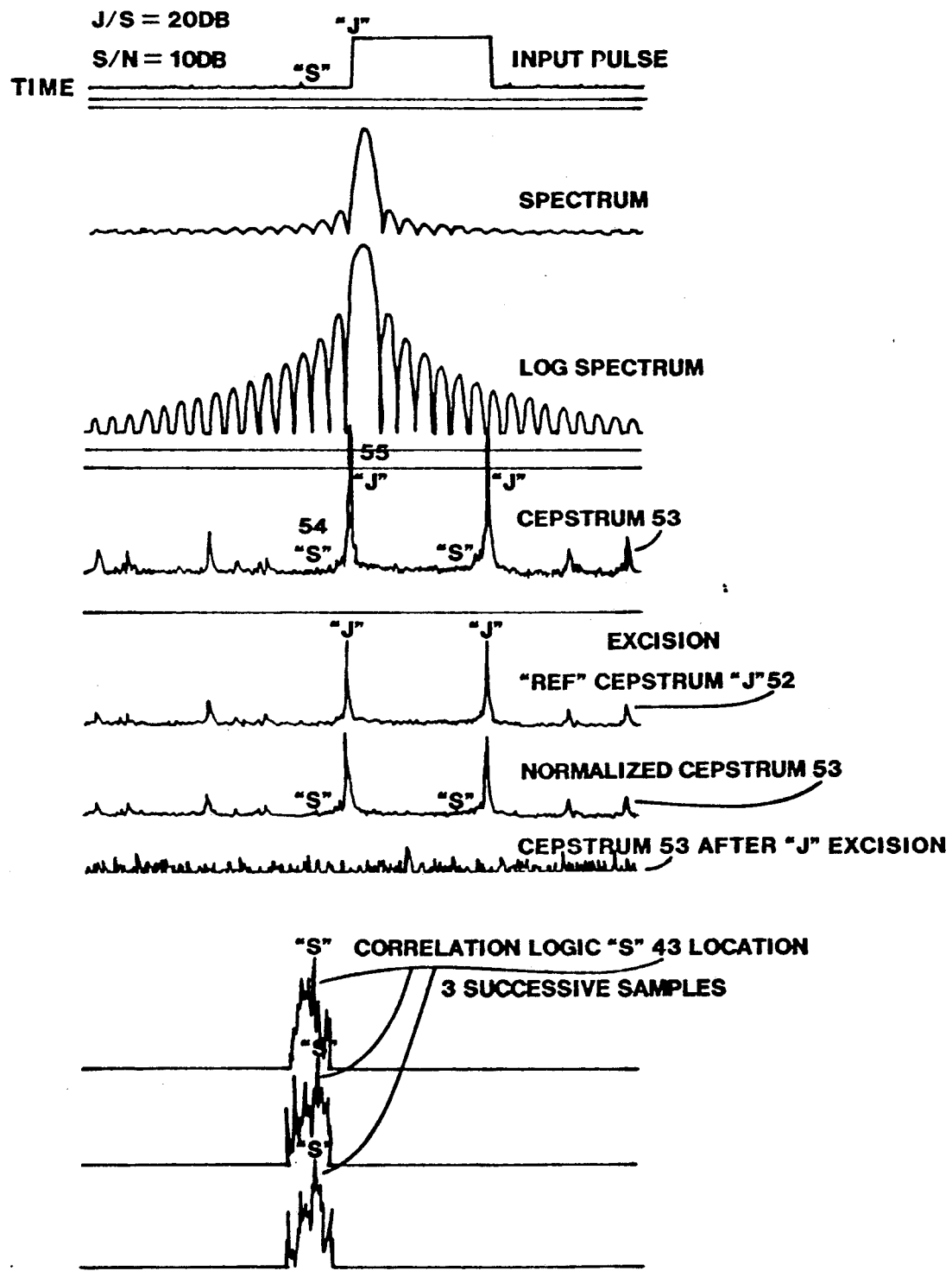
Figure 16:
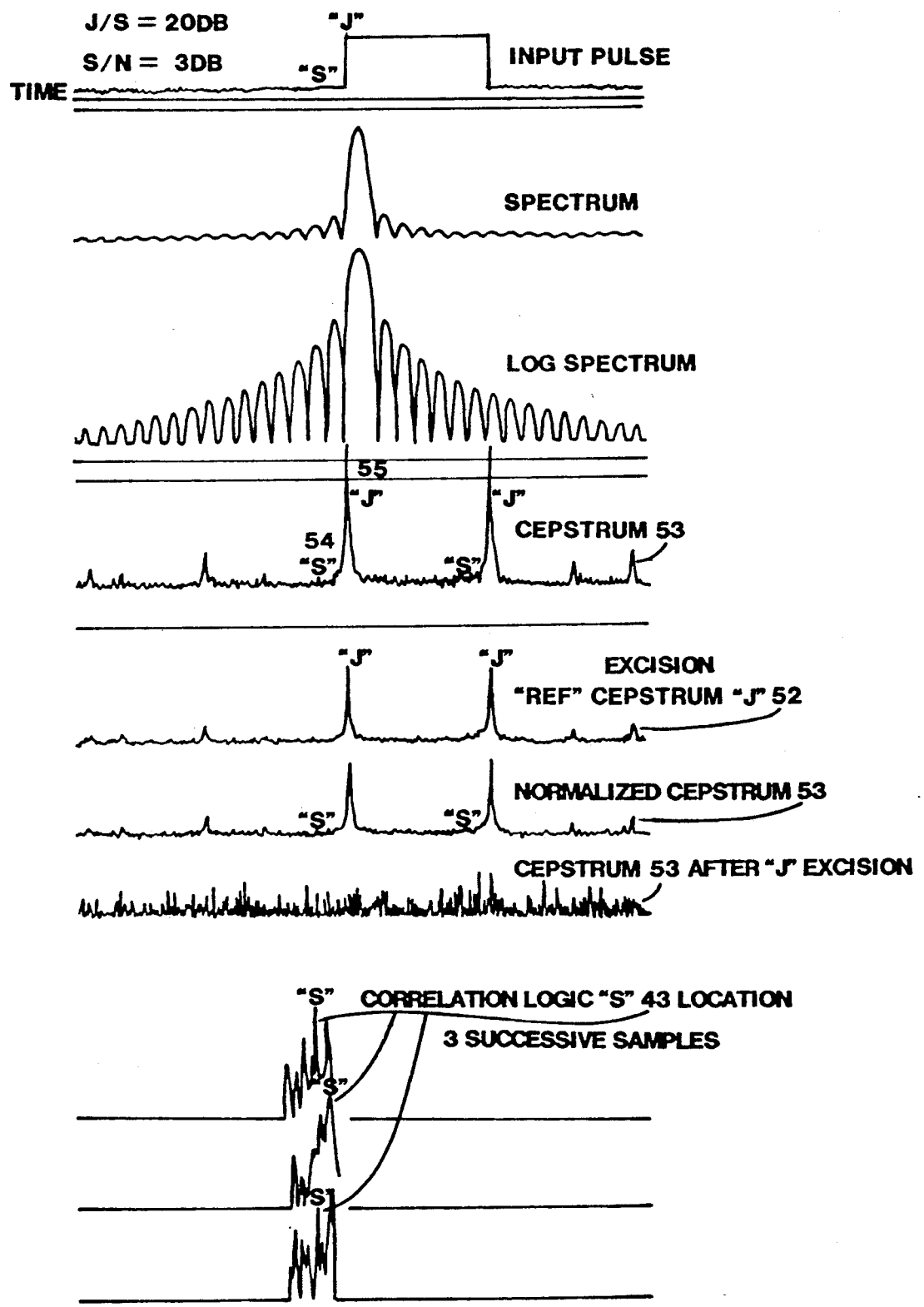

FIGS. 15-16 show the FIG. 9 digital logic 20 performance in discriminating a target in the presence of repeater jamming, for 20 db J/S and variable level of Signal/Noise. FIG. 15 is for the 10 db S/N case. FIG. 16 is for the 3 db S/N case.

Figure 17:
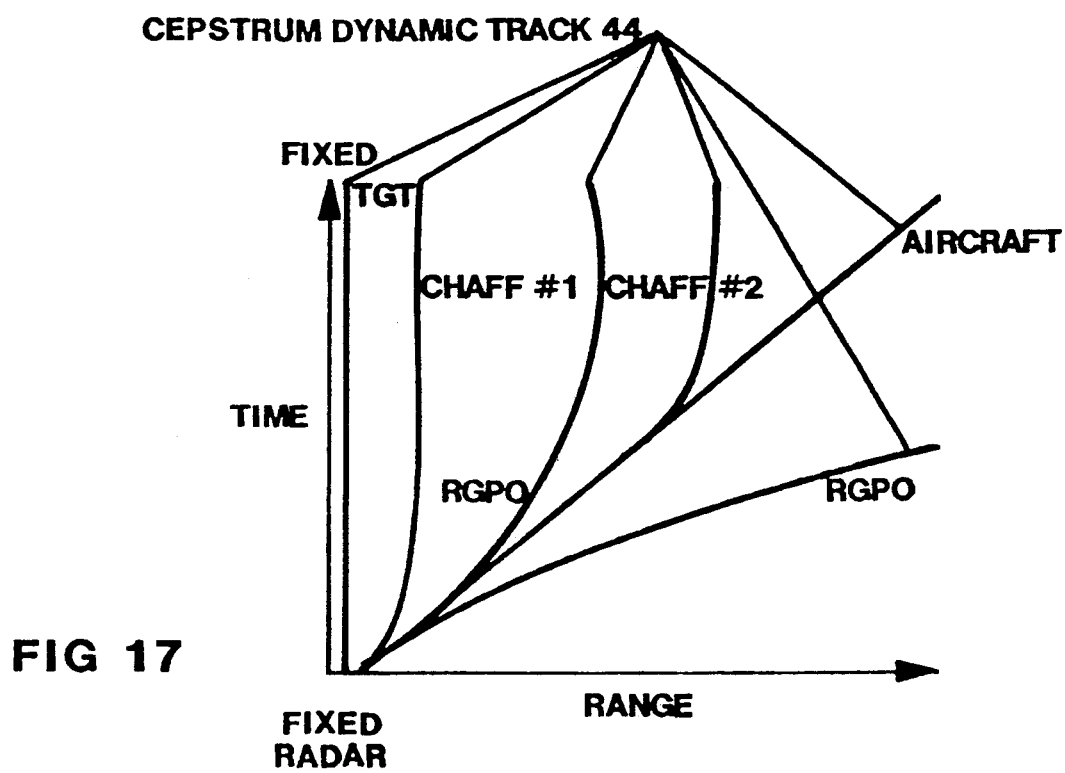

FIG. 17 illustrates non-coherent range rate criteria for discrimination of vehicle targets, chaff, Range Gate Pull-Off (RGPO) ECM.

DESCRIPTION—PREFERRED EMBODIMENT

FIG. 10 illustrates a typical embodiment of the present invention.

Radar transmitted and received echo/jamming returns are coupled from the radar duplexer 21 into this invention. PIN attenuator 22 serves the conventional radar function of Sensitivity Time Control (STC) 23. STC is controlled by digital logic 20. RF preamplifier 24 serves to set the overall receiver sensitivity of this invention. RF preselect bandpass filter (BPF) 25 serves to limit the instantaneous RF bandwidth, and thereby extraneous interference outside the bandwidth of the transmitted waveform. Local oscillator LO) 26 serves to provide RF tuning of this invention to the carrier frequency region of the radar transmitter 27. Both the radar transmitter 27 and the LO tuning 28 are controlled by digital logic 20. RF preamp BPF 25 tracks the RF tuning command so the L.O.. YIG technology is utilized in the present embodiment to permit tuning of both LO 26 and PRE BPF 25. The 6-18 GHz. This permits application of this process to a wide variety of radars, without modification. Interface with the radar duplexer 21 may be made with waveguide or coax, using conventional couplers and adapters.

Mixer 29 provides conversion from the radar RF carrier to the Intermediate Frequency (I.F.), in this embodiment, in the 200-400 MHz region. This is called "Wide Band I.F. (WBIF)", since the instantaneous information bandwidth, from RF through I.F. is tens of MHz. I.F. power amp 30 provides the necessary gain to overcome conversion losses in signal energy through "MD" 18 and "SFE" 19.

Signal Feature Extractor (SFE) 19 is the most significant analog portion of this process. On a single pulse basis, it performs Fourier transforms of incoming signals. Its outputs signal spectrum and cepstrum. The technology applied in this embodiment is the "chirp" transform [2]. Implementation is with Surface Acoustic Wave (SAW) technology [3]. The embodiment shown is multiply-convolve, where the incoming I.F. signal is premultiplied ("M") in mixer 31 by a linear FM "chirp" from SAW dispersive device 32. This SAW is impulsed by impulse generator modulator 33. Impulse timing is controlled by digital logic 20. For optional coherent radar operation, the radar transmitter 27 coherent local oscillator (COHO) is input to modulator 33. Output of multiplier "M" 31 is convolved "C" in a second SAW dispersive device 35. Output is the Fourier transform of the input signal. This transform is on the I.F. carrier. But, the transform is analog time, rather than direct frequency.

The significance of this analog time spectrum waveform is the simplicity in making a matched filter ("MF") 36. A simple transmitted rectangular pulse waveform is permitted by this system. Its spectrum envelope would be similar to the FIG. 7-8 pulse 14 spectrum 15. But, in this SAW embodiment, spectrum 15 horizontal scale is analog time. Spectrum 15 "matched filter" envelope, then, would be its transform, i.e., a BPF with rectangular envelope like the origional pulse envelope 14. Implementation may be with a SAW filter, or active, current differencing amplifiers.

Figure 3:
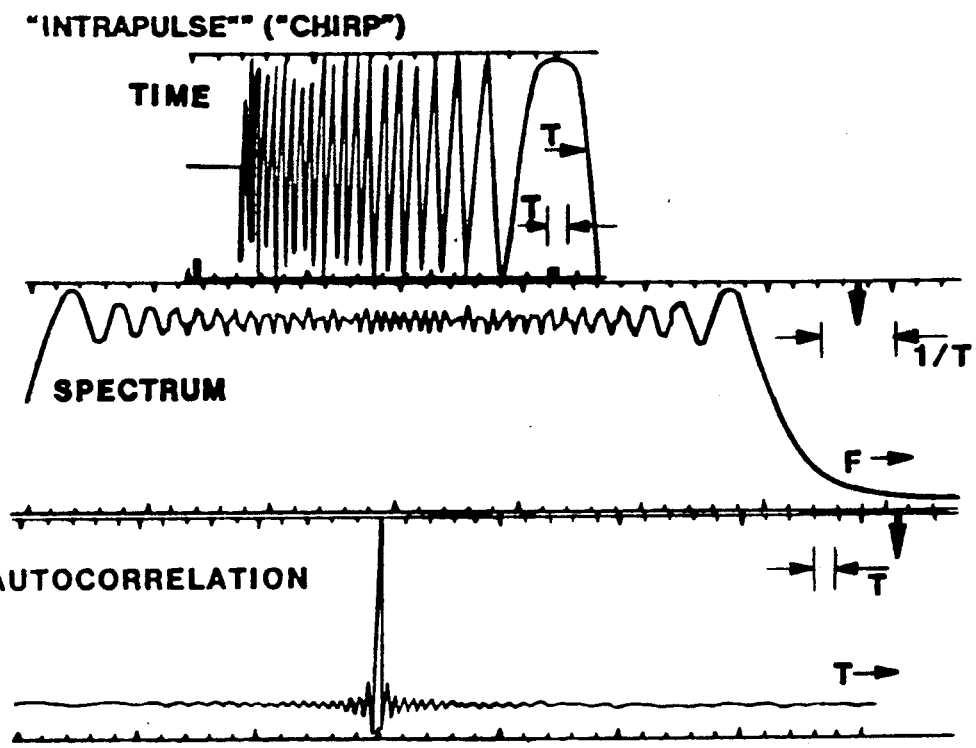
Figure 4:
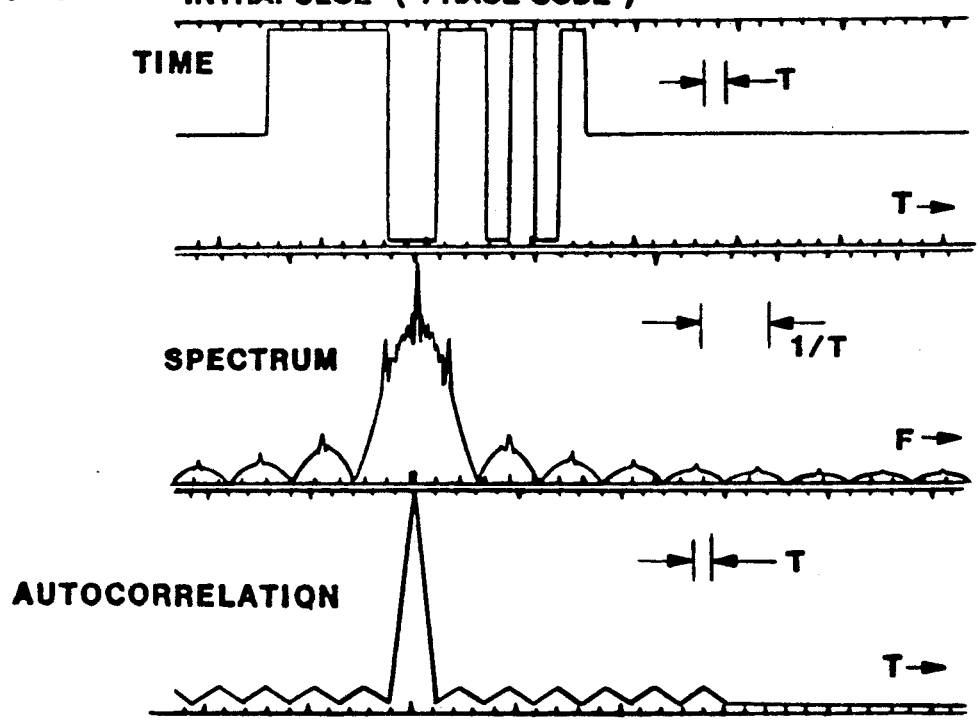
Figure 5:
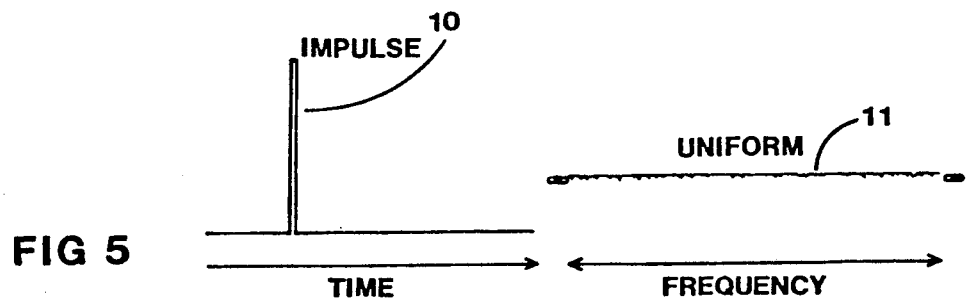
FIGS. 5-6 illustrate Fourier transform relations exploited by this invention. An "impulse" waveform 10 is a very short time domain "spike" of energy. The Fourier transform 11 shows the frequency content required to generate an impulse. That frequency content is uniform over all frequencies from minus to plus infinity. On the other hand, the Fourier transform 12 of a pair of impulses 13 is a periodic sinusoid, of constant amplitude, from minus to plus infinity. The sinusoid period is the reciprocal of the time interval between the impulses.
Figure 6:
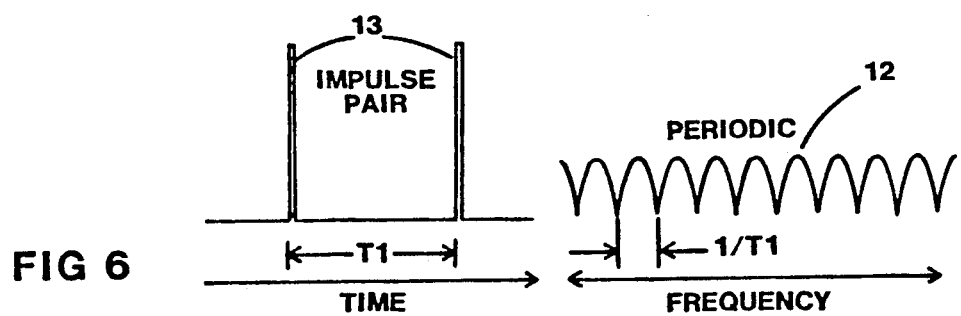

If the radar transmitted waveform were the FIG. 3 linear FM "chirp", convolver SAW 35 output is the FIG. 3 linear FM spectrum, but in analog time. A matched filter would be the inverse transform, approximated by a Gaussian BPF. Again, implementation may be with SAW devices.

Such matched filters optimize signal to thermal noise for that SAW transformed waveform. Detection is accomplished by digital correlation.

The particular "chirp" transform embodiment shown may be implemented with SAW devices providing instantaneous input information bandwidth to include many spectral sidelobes of the radar transmitted rectangular pulse, e.g., 40 MHz. A 10 $\mu$sec duration radar transmitted pulse would have a spectrum first null at the reciprocal of pulse duration, i.e., 0.1 MHz. For a SAW "chirp" transform conversion of 1 MHZ/$\mu$sec, that first null would be at 0.1 $\mu$sec. The "MF" would have a bandwidth the reciprocal of 0.1 $\mu$sec = 10 MHz. That transmitted pulse would be processed with 40 MHz instantaneous information bandwidth, yet post-transform "MF" = 10 MHz. That is a 6 db thermal noise suppression processing gain. That 40 MHz information bandwidth contains 400 transmitted pulse sidelobes. Time-bandwidth product = 400, for subsequent cepstrum processing gain = 26 db. This processing gain is provided without ambiguous sidelobes of conventional pulse compression radars.

Digital logic 20 provides the correlation process which are basic to discrimination of desired targets in simultaneous clutter and jamming interference. "SFE" 19 spectrum and cepstrum information is detected through diodes 38 and digitized in Analog to Digital Converters (ADC) 39. For the process embodiment of "SFE" 19, shown in FIG. 10, "ADC" sample period is 25 $\mu$sec (40 MHz), using a pair of "flash" (20 MHz) technology "ADC" providing alternate bit sampling.

Digital logic 20 embodiment shown in FIG. 10 is based upon the Motorola MVME133 Central Processing Unit (CPU) with MC68020 microprocessor. This is a 32 bit system, operating at 12.5 MHz. Special purpose digital boards for this process provide Random Access Memory (RAM) for "SFE" 19 spectrum 40 and cepstrum 41 data storage. Additional special purpose digital boards for this process provide spectrum correlation 42 and cepstrum correlation 43 detection. Additional special purpose digital functions provided are: target and repeater ECM range/angle track 44, target type classification 45 and ECM/ECCM effectiveness evaluation 46. System clock 47 is the master timing control source for this process. For synchronization, it is also the master timing control for the radar transmitter modulator 48.

ECM/ECCM evaluation 46 provides the primary output to the radar waveform generator (W/F GEN) 49, for radar ECCM control.

OPERATION

FIG. 9 digital logic 20 implementation is based upon the radar received spectrum and cepstrum envelope characteristics. The premise is that there is discrete difference in returns from different man made vehicle "targets" and surface clutter or jamming. The degree of difference shows in both spectrum and cepstrum with resolution the order of 100 KHz and 25 nsec. The embodiment of FIG. 10 provided such resolution. That embodiment was implemented with and field demonstrated with presently available high technology microwave, video, digital devices.

The FIG. 11 mathematical process for acquisition is Product of Transforms Correlation (PTC). Desired target "SKIN" return will be highly correlated with the radar transmitted spectrum and cepstrum "REF". Repeater ("RPTR") jamming returns will be slightly distorted in spectrum and cepstrum. Actual laboratory tests of the FIG. 10 embodiment, with microwave generated "SKIN" and "RPTR" loop amplification returns, showed spectrum envelope asymmetry and corresponding cepstrum differences. Repeater spectrum distortions are premised on nonlinear amplification of the broadband RF Traveling Wave Tube Amplifiers (TWTA), operated in saturation, for peak jammer Effective Radiated Power (ERP). For "SKIN"+"RPTR" case, the spectrum and cepstrum will be asymmetrically distorted, distinguishing "SKIN" from "RPTR". The "CLUTTER" case shows further unique spectrum and cepstrum distortions. The "NARROW BAND NOISE (NBN)" and "WIDEBAND NOISE" cases show unique spectrum/cepstrum distortions. For the case with both "SKIN" and "NBN", carrier frequency set-on error shows as a center frequency displacement from "SKIN". "CHAFF" initially appears as rapid blooming target, with rapid range rate change. This process embodiment provides sufficient spectrum resolution to discriminate Digital RF Memory (DRFM) jammer deception from true "SKIN".

FIG. 11 illustrates the overall logic flow. Initial acquisition is made using "PTC" of spectrum returns. Spectrum correlation reference "REF" 50 is correlated against echo returns 51. A "candidate" target is declared based upon "PTC" waveform criteria. This is "track before detect" in that actual target classification-/identification has not yet been determined.

A "candidate" target declaration in the FIG. 10 embodiment isolates that "candidate" to a 10 $\mu$sec coarse range cell. In the FIG. 10 embodiment, a "3 out of 4" pulse correlation is required for "candidate" target declaration. The "candidate" may be an actual aircraft target, repeater ECM, chaff, or other point source undesired target. The significance of this "track before detect" process is:

(a) simple transmitted pulses are adequate,
(b) no target Doppler or range rate criteria is required,
(c) range track is established within four pulses.

With "track before detect" initiated, high range resolution (HRR) cepstrum acquisition is accomplished. FIG. 11 illustrates the overall logic flow. Cepstrum correlation is the same PTC process applied with the above spectrum correlation. The transmitted "ref" cepstrum 52 is correlated against echo returns 53. The "candidate" target is located with cepstrum HRR. For the FIG. 10 embodiment, time resolution is 25 nsec (12 feet in range), accuracy the order of 100 nsec. This HRR performance is provided even with a simple pulse, historically considered to have range resolution capability related inversely proportional to pulse duration. This process does not require short or complex intrapulse modulated waveforms to accomplish this HRR discrimination. Pulse duration provides necessary energy to ensure S/N for expected engagement target radar cross section and detection range.

In the FIG. 10 embodiment, a "3 out of 4" cepstrum correlation is required for application of cepstrum HRR to averaging and accurate "candidate" target location (i.e., 100 nsec time, 50 feet range).

With HRR location, inputs to the FIG. 10 "SFE" are time/range gated with PIN 22. Fine range cell gate width is transmitted pulsed width +/− 100 nsec. This fine range cell gate essentially blocks out extended range interference, such as clutter, or other isolated point source targets. In addition to this pulse width dimension range gating, input signal peak power is controlled through PIN 22 to optimize SFE spectrum/cepstrum over the highest fidelity operating dynamic range.

Gated spectrum and cepstrum correlation is then applied to discriminate "candidate" targets by class. Fusion of spectrum/cepstrum complimentary information enhances confidence in logic output synergistically, i.e., the result is greater than the sum. The basic objective is to discriminate a target, "S", despite simultaneous interference from jamming, "J", and/or extended range clutter, monopulse. Repeater and chaff "J" returns will correlate closely with "S". Clutter and jammer "noise" (exciter) waveforms are more readily discriminated. Both spectrum and cepstrum differences are exploited by digital logic 20. FIG. 11 illustrates difference in actual cepstrums of aircraft target "S" 54 and repeater "J" 55. Data is from field tests with the FIG. 10 process embodiment. In some cases, the repeater "J" dominated the correlation output. "Track On Jam (TOJ)" mode is applied, with finer range cell (25 nsec resolution) excision of "J". The premise for "TOJ" range excision of "J" is that repeater "J" cepstrum will be similar to the transmitted "REF" cepstrum, but shifted in delay (e.g., 100 nsec) from the repeater host vehicle. By shifting the "REF" to be superimposed upon the total received cepstrum, "J" cancellation may be approximated. "S" search may then be accomplished through the suspect aircraft "S" return, e.g., the 50-100 nsec region before "TOJ", with cepstrum correlation process.

FIGS. 13-16 illustrate "TOJ", "J" excision and correlation logic "S" location. FIGS. 13 & 14 are for "J/S"=6 db & 30 db. FIGS. 15 & 167 are for "J/S"=20 db with "S/N"=10 db & 3 db. Data is from computer modeling.

With target discrimination/detection accomplished, despite simultaneous clutter and jamming interference, ECM effectiveness evaluation 46 may be accomplished. FIG. 12 further illustrates this FIG. 10 Digital Logic 20 process and FIG. 10 ECM/ECCM Evaluation 46 function.

Figure 1:
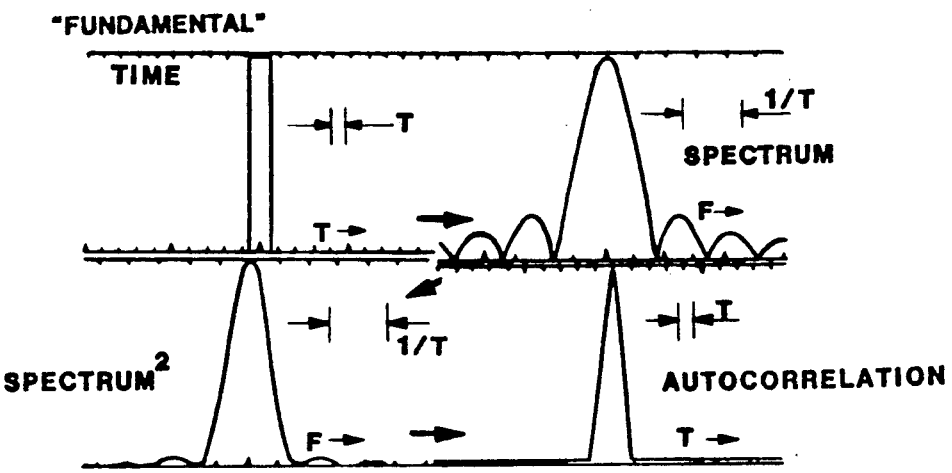
FIGS. 1-4 have shown basis Fourier transform relation to prior art radar waveform design.
Figure 2:
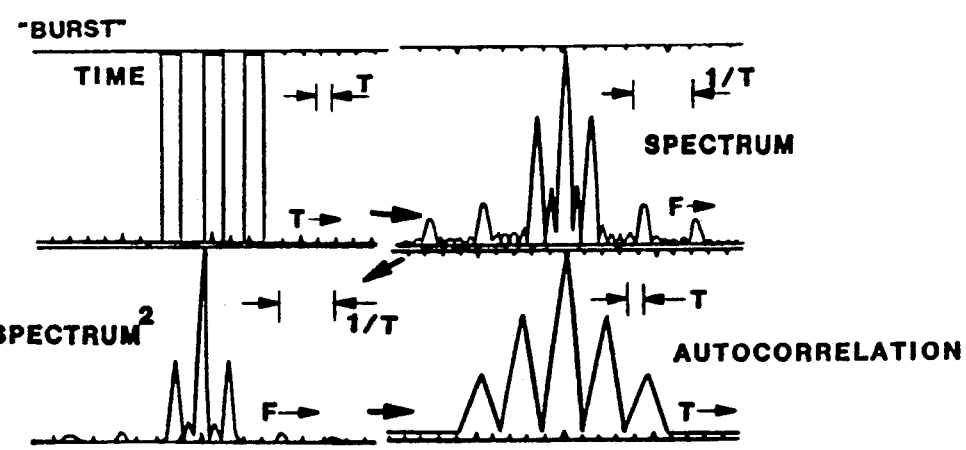

FIG. 2 target/ECM dynamic track 44 is established in the cepstrum domain. FIG. 17 illustrates High Range Resolution (HRR) rate discriminant of vehicle target vs Range Gate Pulloff (RGPO) repeater ECM mode, chaff, fixed targets. Chaff, e.g., is discriminated by very rapid deceleration to wind rate.

With this range discriminant and the previous target discrimination 42, 43, ECM technique is determined 59. With ECM technique determined, Jammer to Skin return ratio (J/S) 60 is measured and averaged over a few pulse sequence. ECM effectiveness 61 is then assessed by entering a stored reference table of ECM effectiveness results from previous actual tests performed against this host radar. ECM effectiveness is most critical in causing angle tracking error in the host radar. Frequently, radars use "target" range (time) or velocity (Doppler) gating of angle track circuits. "ECEM" is an angle gate approach. In essence, "ECEM" success in preventing ECM effectiveness is to provide high confidence ability to discriminate dynamic range track on actual desired targets in simultaneous interference, including deception. ECCM techniques 62 to counter would also be stored in a reference table from previous actual tests. Generic ECCM technique vs exciter/noise ECM is carrier frequency change, pulse to pulse or burst to burst. Generic ECCM technique vs repeater is HRR range (time) gating. This invention provides real time discrimination against both exciter/DRFM and repeater/decoys.

Target classification 45 may be provided through the HRR range (time) resolution. The FIG. 10 embodiment provided 25 nsec (12 ft range) resolution. In actual field tests vs airborne targets of opportunity, finite HRR cepstrum features 63 were discriminated between a helicopter and tactical aircraft.

The FIG. 12 executive controls enable interface between the FIG. 10 "ECEM" logic 20 and the radar transmitter 27, modulator 48 and waveform generator (W/F GEN) 49.

CONCLUSION, RAMIFICATIONS, SCOPE OF INVENTION

Accordingly, this process can be used to enhance detection and classification of radar targets in simultaneous interference from clutter and ECM. This may be accomplished with conventional non coherent, low duty cycle pulsed waveform magnetron/klystron radars, such as have been in operational use since the early 1940's. The processing of returns from radar transmissions are resolved both in frequency and time with high resolution in both frequency and time. This high resolution is essentially unambiguous.

This process may be and has been implemented with present commercially available analog microwave/video devices; with commercially available "chips" for digital processing. The resulting implementation is fast, relatively small, relatively light weight.

The system may be applied in a wide variety of radars. The process is generic for any radar/communication/data link waveform.

Although the description above contains many specificities, these should not be construed as limiting scope, but merely providing illustrations.

I claim:

1. A electronic combat effectiveness monitor receiver for enhancing detection and track of host radar targets in simultaneous jamming and clutter interference comprising:

signal processing means for extracting spectrums from said host radar transmitted and received waveforms, amplifying means for raising the power of said spectrums sidelobes to produce amplified sidelobe waveforms, signal processing means for extracting cepstrums of said amplified sidelobe waveforms, digital processor means for correlating said received spectrums against said transmitted reference spectrums stored in digital memory, digital processor means for correlating said received cepstrums against said transmitted reference cepstrums stored in digital memory, digital processor means for discriminating desired targets from said jamming and said clutter.

2. The process of claim 1 wherein said monitor received includes means for evaluating the effectiveness of said jamming directed at said host radar comprising:

digital processor means for discriminating various modes of said jamming from simultaneous echos from said targets and said clutter returns, digital processor means for measuring relative power of said jammer versus said targets, digital processor means for comparing said jamming modes and said relative power with previous test data, to determine said jamming effectiveness, the test data being for the same waveform as transmitted by the said host radar and the same mode of said jamming, digital memory means for storing said previous test data and instantaneous angle error associated with said jamming modes and said relative power, digital processor means for determining and implementing waveform changes for said host radar electronic counter-counter measures.

3. The process of claim 1 wherein said monitor receiver includes means for determining target classification comprising:

digital processor means for comparing said cepstrum waveforms with stored data from tests against known targets, digital memory means for storing said cepstrum data from said known targets.

* * * * *